(12) United States Patent
Tominaga

(10) Patent No.: US 11,121,250 B2
(45) Date of Patent: Sep. 14, 2021

(54) SILICON CARBIDE SEMICONDUCTOR DEVICE

(71) Applicant: Mitsubishi Electric Corporation, Tokyo (JP)

(72) Inventor: Takaaki Tominaga, Tokyo (JP)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 0 days.

(21) Appl. No.: 16/956,613

(22) PCT Filed: Feb. 19, 2018

(86) PCT No.: PCT/JP2018/005693
§ 371 (c)(1),
(2) Date: Jun. 22, 2020

(87) PCT Pub. No.: WO2019/159351
PCT Pub. Date: Aug. 22, 2019

(65) Prior Publication Data
US 2020/0388704 A1    Dec. 10, 2020

(51) Int. Cl.
*H01L 29/78* (2006.01)
*H01L 29/16* (2006.01)
(Continued)

(52) U.S. Cl.
CPC ...... *H01L 29/7813* (2013.01); *H01L 29/1083* (2013.01); *H01L 29/1608* (2013.01);
(Continued)

(58) Field of Classification Search
CPC . H01L 29/06; H01L 29/0623; H01L 29/0696; H01L 29/16; H01L 29/1608;
(Continued)

(56) References Cited

U.S. PATENT DOCUMENTS 9,281,394 B2 * 3/2016 Yilmaz ................. H01L 27/088
2010/0140696 A1 * 6/2010 Yedinak ............... H01L 29/7811
257/334
(Continued)

FOREIGN PATENT DOCUMENTS

JP    2004-273647 A    9/2004
WO   2010/098294 A1   9/2010
(Continued)

OTHER PUBLICATIONS

International Search Report and Written Opinion dated Apr. 24, 2018 for PCT/JP2018/005693 filed on Feb. 19, 2018, 9 pages including English Translation of the International Search Report.

*Primary Examiner* — Fazli Erdem
(74) *Attorney, Agent, or Firm* — Xsensus LLP

(57) ABSTRACT

In an element region and a non-element region, a silicon carbide semiconductor device includes a drift layer having a first conductivity type provided on a silicon carbide semiconductor substrate. In the element region, the silicon carbide semiconductor device includes a first trench that reaches the drift layer, and a gate electrode provided in the first trench through a gate insulation film and electrically connected to a gate pad electrode. In the non-element region, the silicon carbide semiconductor device includes a second trench whose bottom surface reaches the drift layer, a second relaxation region having a second conductivity type disposed below the second trench, an inner-surface insulation film provided on a side surface and on the bottom surface of the second trench, and a low-resistance region provided in the second trench through the inner-surface insulation film and electrically insulated from the gate pad electrode.

13 Claims, 20 Drawing Sheets

(51) Int. Cl.
*H01L 29/06* (2006.01)
*H01L 29/10* (2006.01)
*H01L 29/40* (2006.01)

(52) U.S. Cl.
CPC .......... *H01L 29/404* (2013.01); *H01L 29/407* (2013.01); *H01L 29/1045* (2013.01)

(58) Field of Classification Search
CPC . H01L 29/1083; H01L 29/78; H01L 29/7805; H01L 29/7813; H01L 29/404; H01L 29/407
USPC ......................................................... 257/77
See application file for complete search history.

(56) References Cited

U.S. PATENT DOCUMENTS

| | | |
|---|---|---|
| 2011/0278599 A1 | 11/2011 | Nakao et al. |
| 2013/0285140 A1 | 10/2013 | Kagawa et al. |
| 2016/0071922 A1 | 3/2016 | Kagawa et al. |
| 2017/0018627 A1* | 1/2017 | Li .................. H01L 21/0465 |
| 2017/0040423 A1* | 2/2017 | Inoue .................. H01L 29/06 |
| 2017/0162649 A1 | 6/2017 | Kagawa et al. |
| 2018/0248008 A1* | 8/2018 | Sugawara .......... H01L 29/7813 |
| 2019/0081170 A1* | 3/2019 | Kumagai ............ H01L 21/0465 |

FOREIGN PATENT DOCUMENTS

| | | |
|---|---|---|
| WO | 2012/077617 A1 | 6/2012 |
| WO | 2016/006696 A1 | 1/2016 |
| WO | 2018/038133 A1 | 3/2018 |
| WO | 2019/159350 A1 | 8/2019 |

* cited by examiner

F I G. 3
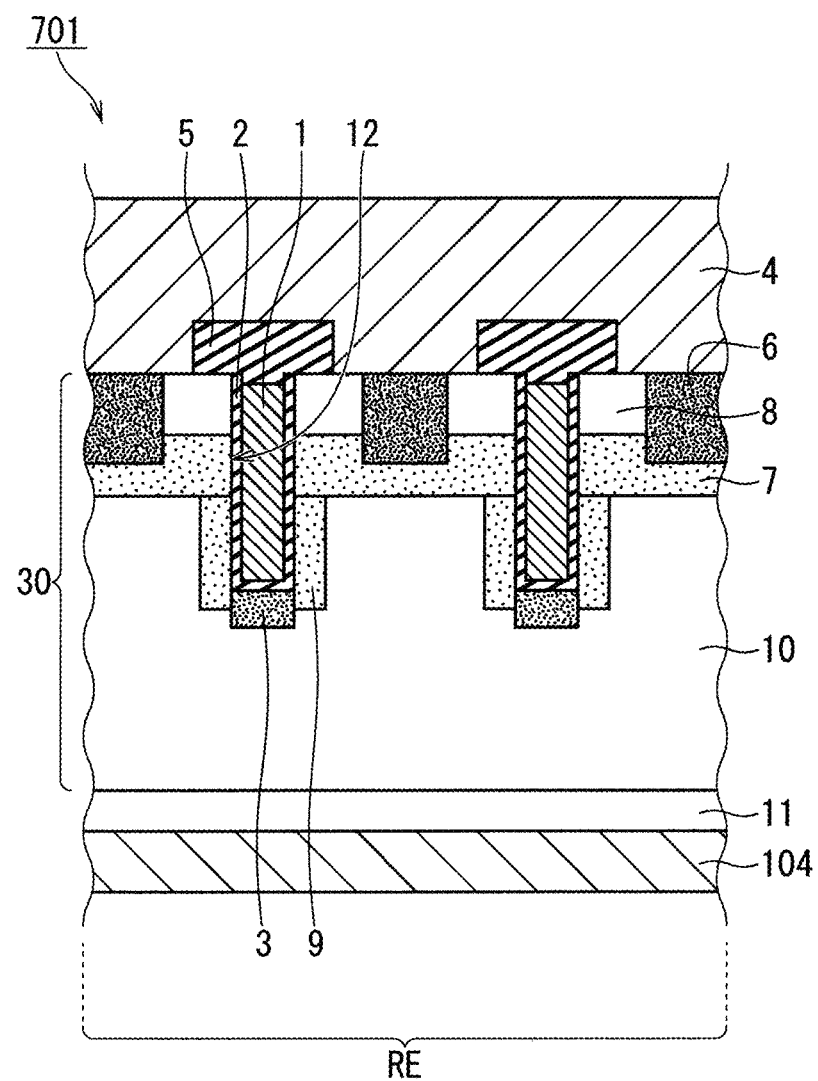

F I G. 5
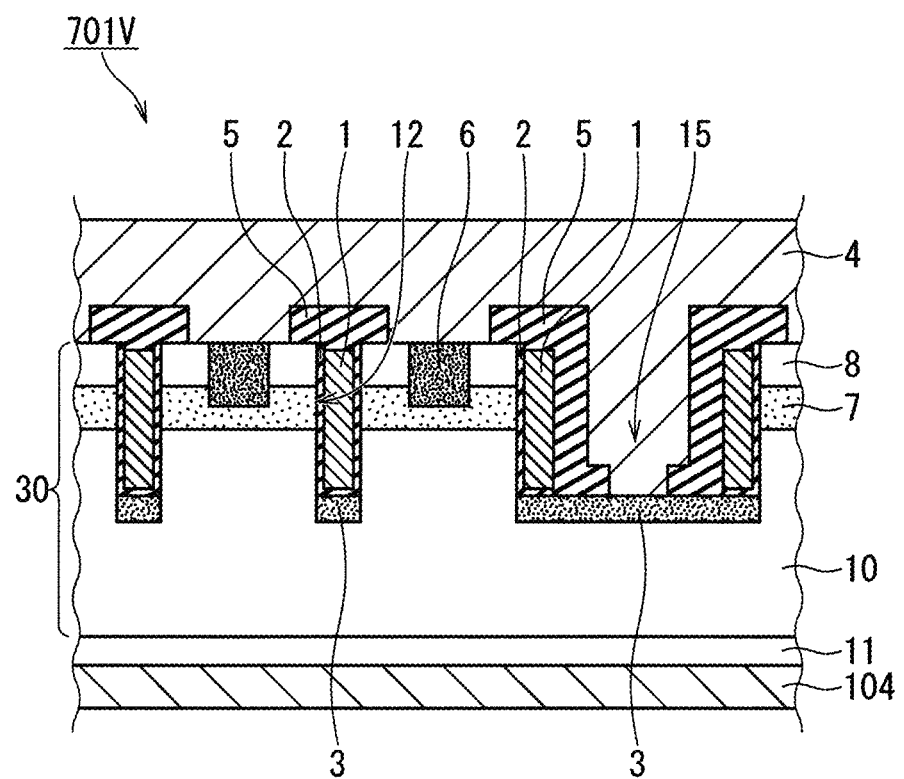

F I G. 1 6
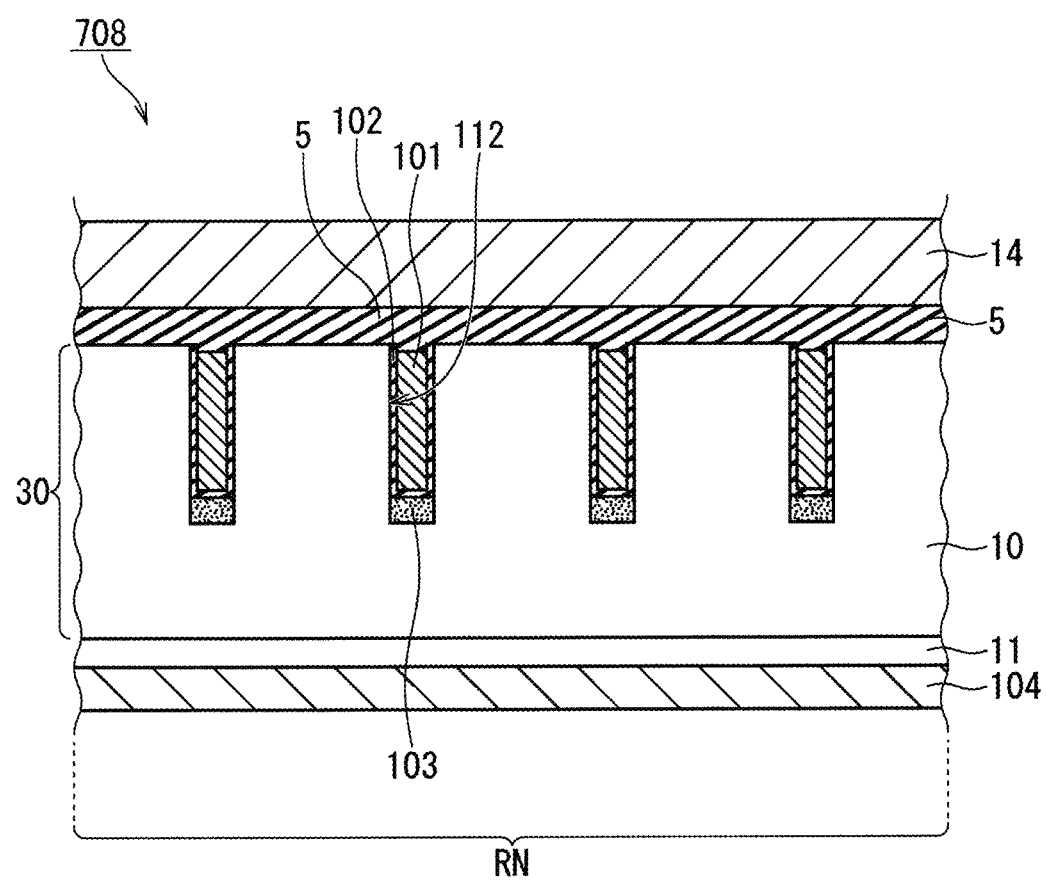

SILICON CARBIDE SEMICONDUCTOR DEVICE

CROSS-REFERENCE TO RELATED APPLICATIONS

The present application is based on PCT filing PCT/JP2018/005693, filed Feb. 19, 2018, the entire contents of which are incorporated herein by reference. The present application is also related to co-pending U.S. application Ser. No. 16/956,611, entitled SILICON CARBIDE SEMICONDUCTOR DEVICE, which is based on PCT/JP2018/005688, filed Feb. 19, 2018, the entire contents of which are incorporated herein by reference.

TECHNICAL FIELD

The present invention relates to a silicon carbide semiconductor device.

BACKGROUND ART

As a switching element used in an inverter circuit or the like, a vertical power semiconductor device is widely used, and particularly a vertical power semiconductor device having a metal-oxide-semiconductor (MOS) structure is widely used. Typically, an insulated gate bipolar transistor (IGBT) and a metal-oxide-semiconductor field-effect transistor (MOSFET) are used. For example, WO 2010/098294 (Patent Document 1) discloses a MOSFET, and Japanese Patent Application Laid-Open No. 2004-273647 (Patent Document 2) discloses an IGBT. Patent Document 1 particularly discloses a vertical n-channel MOSFET that uses silicon carbide (SiC) as a semiconductor material. Further, WO 2012/077617 (Patent Document 3) discloses a trench-gate MOSFET, with the aim of further reducing an on-voltage of a vertical n-channel MOSFET using silicon carbide.

The n-channel MOSFET includes an n-type drift layer, and a p-type well provided on the n-type drift layer. When the MOSFET is switched from an on state to an off state, a drain voltage of the MOSFET, i.e., a voltage of a drain electrode, drastically increases from nearly zero volts to several hundreds of volts. In this case, a displacement current is generated through parasitic capacitance present between the p-type well and the n-type drift layer. A displacement current generated on the drain electrode side flows to the drain electrode, and a displacement current generated on the source electrode side flows to the source electrode through the p-type well.

Here, in the vertical n-channel MOSFET, typically, other p-type wells are provided in an outer peripheral region of a chip in addition to the p-type well constituting a MOSFET cell that actually functions as the MOSFET. Examples of such other p-type wells include one positioned immediately below a gate pad. These p-type wells in the outer peripheral region usually have a significantly larger cross-sectional area in the horizontal plane (area in the plane layout) than the p-type well in the MOSFET cell. Accordingly, in the p-type wells in the outer peripheral region, the above-mentioned displacement current needs to flow in a long path to reach the source electrode. The p-type wells thus have high electric resistance as a current path for the displacement current. As a result, intolerably large potential drop may occur in the p-type wells. Thus, in the p-type wells, a relatively large potential difference with respect to a source potential is generated at a position that is far from a position connected to the source electrode in the in-plane direction. This may raise concern about occurrence of dielectric breakdown due to the potential difference.

In recent years, a semiconductor device that uses silicon carbide having a bandgap approximately three times as large as a bandgap of silicon, the most general semiconductor material, has been started to be used as a switching element of an inverter circuit, and particularly an n-channel MOSFET has been put into use. The use of a semiconductor having a wide bandgap allows for reduction of losses of an inverter circuit. To further reduce losses, it is required to drive a switching element at higher speed. In other words, to reduce losses, it is required to further increase dV/dt, which represents variation of a drain voltage V with respect to time t. In such a case, the displacement current that flows into the p-type well through parasitic capacitance is also increased. In addition, it is more difficult to perform treatment of reducing electric resistance by means of doping on silicon carbide than silicon. Thus, when silicon carbide is used, the p-type well is liable to have large parasitic resistance. Such large parasitic resistance may easily lead to large potential drop in the p-type well. Under the circumstances as described above, the use of silicon carbide may raise greater concern about the above-mentioned dielectric breakdown.

In the technology of WO 2010/098294 described above, a low-resistance p-type semiconductor layer is provided on the entire or partial upper surface of the p-type well that is positioned below the gate pad in the outer peripheral region. This allows for reduction of voltage distribution in the p-type well due to potential drop occurring when a displacement current flows in the p-type well positioned below the gate pad. Consequently, a potential difference between the p-type well and the gate electrode is reduced. Consequently, a breakdown of a gate insulation film is reduced.

PRIOR ART DOCUMENTS

Patent Documents

Patent Document 1: WO 2010/098294
Patent Document 2: Japanese Patent Application Laid-Open No. 2004-273647
Patent Document 3: WO 2012/077617

SUMMARY

Problem to be Solved by the Invention

A planar MOSFET and a trench MOSFET usually have different configurations of their outer peripheral regions (in a more general term, "non-element regions"). The technology of WO 2010/098294 described above relates to a planar MOSFET, and is thus not necessarily appropriate for the trench type.

The present invention is made in order to solve the problems as described above, and has an object to provide a trench silicon carbide semiconductor device that is capable of reducing element breakdown at the time of switching by reducing potential drop occurring when a displacement current flows.

Means to Solve the Problem

A silicon carbide semiconductor device according to the present invention is a silicon carbide semiconductor device including an element region being provided on a silicon carbide semiconductor substrate and a non-element region being provided outside the element region, in which a gate pad electrode being connected to outside and being supplied with a gate voltage from the outside is disposed in the non-element region. In the element region and the non-element region, the silicon carbide semiconductor device includes a drift layer having a first conductivity type being provided on the silicon carbide semiconductor substrate. In the element region, the silicon carbide semiconductor device includes a first trench whose bottom surface reaches the drift layer, and a gate electrode being provided in the first trench through a gate insulation film and being electrically connected to the gate pad electrode. In the non-element region, the silicon carbide semiconductor device includes at least one second trench whose bottom surface reaches the drift layer, at least one second relaxation region having a second conductivity type being disposed below the at least one second trench, an inner-surface insulation film being provided on a side surface and on the bottom surface of the at least one second trench, and a low-resistance region being provided in the at least one second trench through the inner-surface insulation film and being electrically insulated from the gate pad electrode.

Effects of the Invention

According to the present invention, capacitance is formed owing to the provision of the low-resistance region in the second trench through the inner-surface insulation film. Consequently, at the time of high-speed switching of the silicon carbide semiconductor device, a displacement current that passes through the second relaxation region below the second trench can be caused to branch into the low-resistance region through capacitive coupling. Consequently, the magnitude of potential drop due to the displacement current can be reduced.

These and other objects, features, aspects and advantages of the present invention will become more apparent from the following detailed description of the present invention when taken in conjunction with the accompanying drawings.

BRIEF DESCRIPTION OF DRAWINGS

FIG. 3 is a schematic partial cross-sectional view taken along the line of FIG. 1.

FIG. 5 is a partial cross-sectional view schematically illustrating a configuration of a silicon carbide device according to a modification of the first embodiment of the present invention, taken along the line V-V of FIG. 6.

FIG. 16 is a partial cross-sectional view taken along the line XVI-XVI of FIG. 15.

DESCRIPTION OF EMBODIMENTS

Embodiments of the present invention will be described below with reference to the drawings. Note that, in the following drawings, the same or equivalent parts will be denoted by the same reference signs, and description thereof will not be repeated.

First Embodiment (Configuration)

Figure 1:
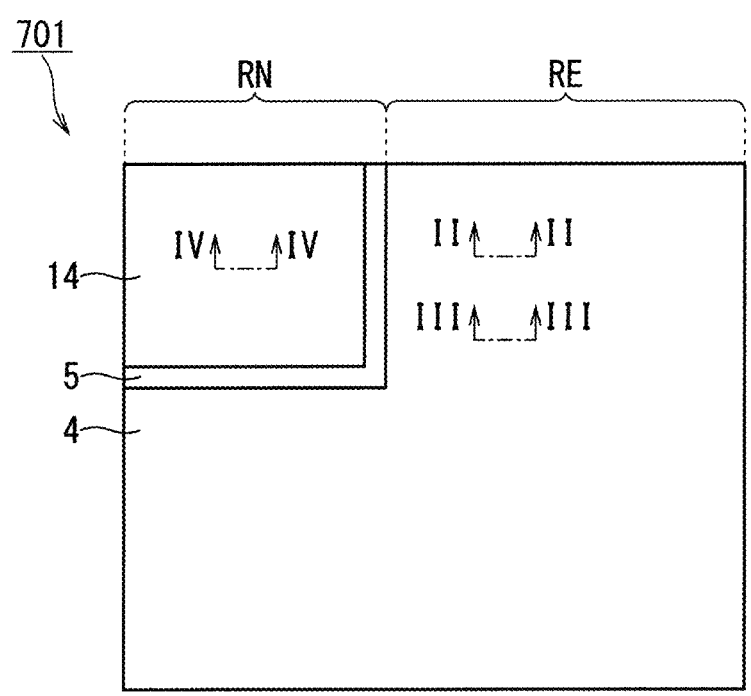
FIG. 1 is a plan view schematically illustrating a configuration of a silicon carbide device according to the first embodiment of the present invention.

FIG. 1 is a plan view schematically illustrating a configuration of a MOSFET 701 (silicon carbide semiconductor device) according to the first embodiment. The MOSFET 701 includes an element region RE provided on a substrate 11 (silicon carbide semiconductor substrate) and a non-element region RN provided outside the element region RE. In the MOSFET 701, a gate pad electrode 14 connected to the outside and supplied with a gate voltage from the outside is disposed in the non-element region RN. A wire made of metal such as aluminum is connected to the gate pad electrode 14 by means of ultrasonic joining or the like. The non-element region RN may include a termination region of the MOSFET 701. The element region RE includes a region in which channels controlled by gate electrodes are disposed, and typically is a region in which a MOSFET cell that actually functions as a MOSFET is disposed.

Figure 2:
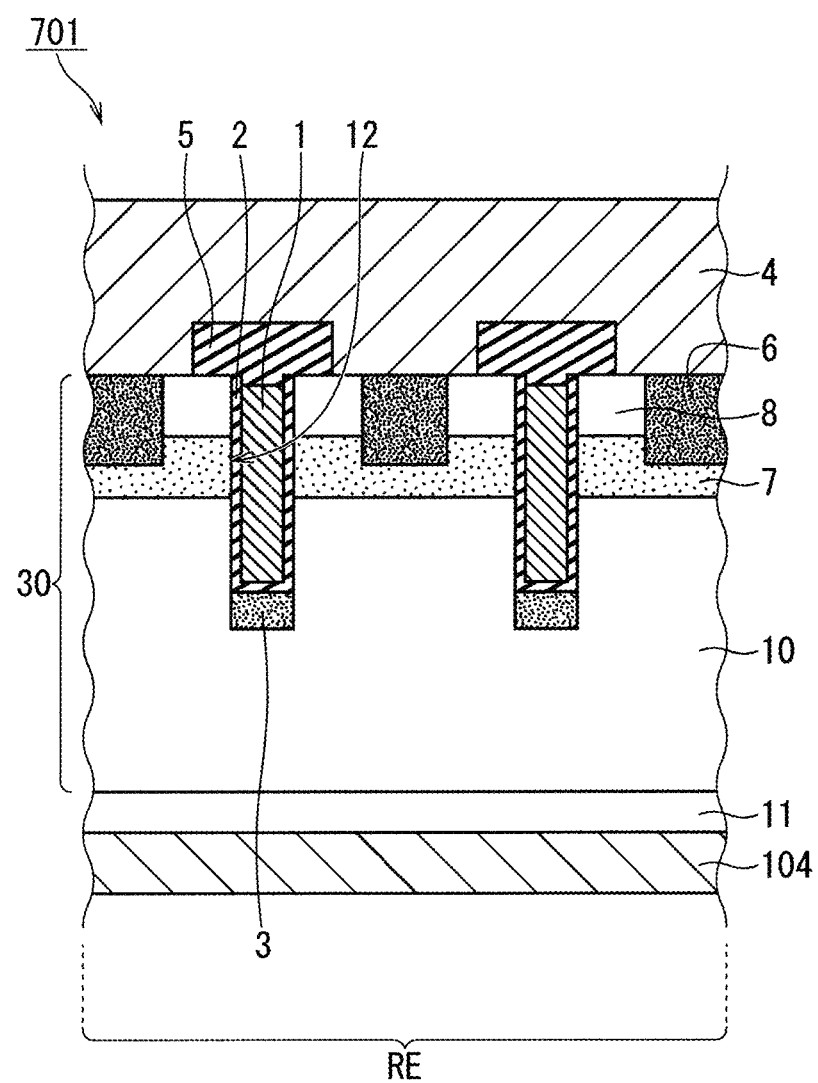
FIG. 2 is a schematic partial cross-sectional view taken along the line II-II of FIG. 1.
Figure 4:
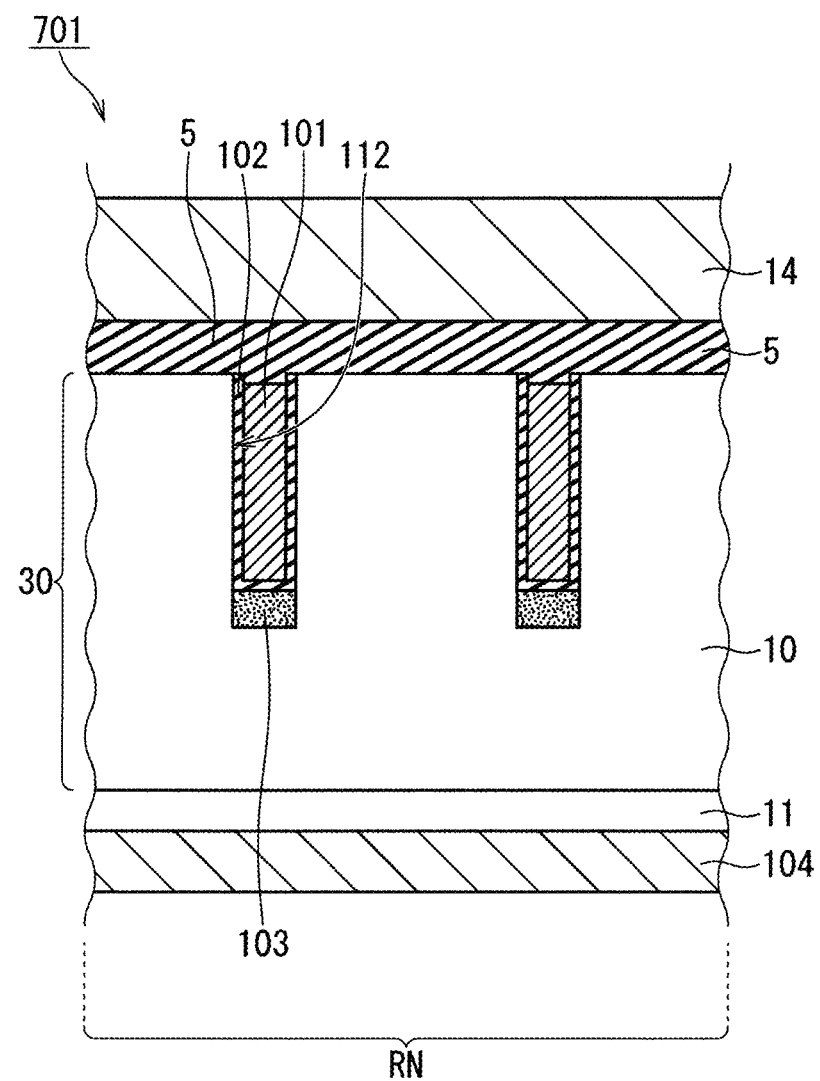
FIG. 4 is a schematic partial cross-sectional view taken along the line IV-IV of FIG. 1.

FIG. 2 and FIG. 3 schematically illustrate different partial cross-sections in the element region RE taken along the line II-II and the line of FIG. 1, respectively. FIG. 4 schematically illustrates a partial cross-section in the non-element region RN taken along the line IV-IV of FIG. 1. Note that, in these cross-sectional diagrams and other cross-sectional diagrams to be described later, regions having a p type (second conductivity type) are dotted.

In the element region RE and the non-element region RN, the MOSFET 701 includes a drift layer 10 having an n type (first conductivity type) provided on the substrate 11. Further, in the element region RE, the MOSFET 701 includes a first trench 12 whose bottom surface reaches the drift layer 10, and a gate electrode 1 provided in the first trench 12 through a gate insulation film 2 and electrically connected to the gate pad electrode 14. Further, in the non-element region RN, the MOSFET 701 includes at least one second trench 112 whose bottom surface reaches the drift layer, at least one second relaxation region 103 having a p type (second conductivity type) disposed below the second trench 112, an inner-surface insulation film 102 provided on a side surface and on the bottom surface of the second trench 112, and a low-resistance region 101 provided in the second trench 112 through the inner-surface insulation film 102 and electrically insulated from the gate pad electrode 14. An epitaxial layer 30 (silicon carbide semiconductor layer) is provided on the substrate 11. The epitaxial layer 30 includes the drift layer 10, a base region 7, a source region 8, a high-concentration region 6, a first relaxation region 3, a second relaxation region 103, and a connection region 9. In the epitaxial layer 30, the first trench 12 (FIG. 2 and FIG. 3) and the second trench 112 (FIG. 4) are provided. Further, the MOSFET 701 includes a source pad electrode 4, a drain electrode 104, an inter-layer insulation film 5, and a low-resistance region 101.

The substrate 11 extends across the element region RE and the non-element region RN. The substrate 11 has an n type (first conductivity type). The epitaxial layer 30 is provided by means of epitaxial growth on the substrate 11, and extends across the element region RE and the non-element region RN.

The drift layer 10 is provided on the substrate 11 so as to extend across the element region RE and the non-element region RN. The drift layer 10 is made of silicon carbide. The drift layer 10 has the n type, and has donor concentration of $1 \times 10^{14}$ cm$^{-3}$ to $1 \times 10^{17}$ cm$^{-3}$. It is preferable that the donor concentration of the drift layer 10 be lower than donor concentration of the substrate 11.

The base region 7 is disposed in the element region RE, and is provided on the drift layer 10. The base region 7 has a p type (second conductivity type different from the first conductivity type), and preferably has acceptor concentration of $1 \times 10^{14}$ cm$^{-3}$ to $1 \times 10^{18}$ cm$^{-3}$. Note that the acceptor concentration and thickness of the base region 7 need not be uniform. The source region 8 is disposed in the element region RE, and is provided on the base region 7. The source region 8 has the n type, has donor concentration higher than the donor concentration of the drift layer 10, and specifically has donor concentration of $1 \times 10^{18}$ cm$^{-3}$ to $1 \times 10^{20}$ cm$^{-3}$. The high-concentration region 6 is disposed in the element region RE, and penetrates the source region 8 to reach the base region 7. The high-concentration region 6 has the p type, has acceptor concentration higher than the acceptor concentration of the base region 7, and specifically has acceptor concentration of $1 \times 10^{19}$ cm$^{-3}$ to $1 \times 10^{21}$ cm$^{-3}$.

In the present embodiment, as illustrated in FIG. 2, a plurality of first trenches 12 are disposed in the element region RE at intervals. Note that the plurality of first trenches 12 in a certain cross-section, such as those illustrated in FIG. 2, may be connected to one another in the plane layout. The first trench 12 includes a side surface and a bottom surface. The side surface of the first trench 12 penetrates the source region 8 and the base region 7. The side surface of the first trench 12 reaches the drift layer 10 in the cross-section of FIG. 2. In this manner, channels of the MOSFET are configured in the cross-section of FIG. 2. The first relaxation region 3 is disposed below the first trench 12, and is in contact with the drift layer 10. Typically, the first relaxation region 3 is in contact with the bottom surface of the first trench 12. The first relaxation region 3 has the p type, and preferably has acceptor concentration of $1 \times 10^{14}$ cm$^{-3}$ to $1 \times 10^{18}$ cm$^{-3}$. Note that the acceptor concentration and thickness of the first relaxation region 3 need not be uniform.

The gate insulation film 2 is provided on the side surface and on the bottom surface of the first trench 12. The thickness (horizontal dimension of FIG. 2 and FIG. 3) of the gate insulation film 2 on the side surface of the first trench 12 is, for example, 10 nm or more and 300 nm or less. The thickness (vertical dimension of FIG. 2 and FIG. 3) of the gate insulation film 2 on the bottom surface of the first trench 12 is, for example, 10 nm or more and 300 nm or less. The gate insulation film 2 is mainly made of, for example, silicon dioxide. At least a part of the gate electrode 1 is provided in the first trench 12 through the gate insulation film 2.

The source pad electrode 4 is electrically connected to the source region 8 and the high-concentration region 6 by means of ohmic junction or Schottky junction. In order to achieve this electrical connection, the source pad electrode 4 is in contact with the source region 8 and the high-concentration region 6. Note that a part of the source pad electrode 4 to come in contact with the source region 8 and the high-concentration region 6 may be silicided. In other words, the source pad electrode 4 may include a silicide layer in contact with the source region 8 and the high-concentration region 6. The source pad electrode 4 is separated from the gate electrode 1 by the inter-layer insulation film 5.

The source pad electrode 4 is electrically connected to the first relaxation region 3. In the present embodiment, the source pad electrode 4 is connected to the first relaxation region 3 having the p type through only a semiconductor region having the p type. Specifically, as illustrated in FIG. 3, the source pad electrode 4 is connected to the first relaxation region 3 through the high-concentration region 6, the base region 7, and the connection region 9. In order to achieve such electrical connection, in a region between the base region 7 and the bottom surface of the first trench 12, the connection region 9 is provided adjacently to the side surface of the first trench 12. As described above, the connection region 9 has the p type, and preferably has acceptor concentration of $1 \times 10^{14}$ cm$^{-3}$ to $1 \times 10^{18}$ cm$^{-3}$. Note that the acceptor concentration and thickness of the connection region 9 need not be uniform. A plurality of connection regions 9 separated from one another in the plane layout may be provided. Further, although the connection region 9 is provided on both the sides of the first trench 12 in FIG. 3, the connection region 9 may be provided on only either side thereof. Further, disposition of one connection region 9 provided on one side of the first trench 12 and disposition of another connection region 9 provided on the other side of the first trench 12 may be different in the longitudinal direction of the first trench 12.

The gate pad electrode 14 is disposed in the non-element region RN, and is electrically connected to the gate electrode 1 by means of ohmic junction or Schottky junction. In order to achieve this electrical connection, for example, the gate electrode 1 includes a part that extends from the element region RE to the non-element region RN, and this extending part is in contact with the gate pad electrode 14 in the non-element region RN. In this manner, ohmic contact or Schottky contact is provided between the gate pad electrode 14 and the gate electrode 1.

In the non-element region RN, an upper surface (surface in which the second trench 112 is provided) of the epitaxial layer 30 is insulated from the gate pad electrode 14 by the inter-layer insulation film 5.

The second trench 112 (FIG. 4) is disposed in the non-element region RN. The second trench 112 includes a side surface and a bottom surface. In the present embodiment, the side surface of the second trench 112 may face only the drift layer 10. The second trench 112 may have depth the same as the depth of the first trench 12. In the present embodiment, as illustrated in FIG. 4, a plurality of second trenches 112 are disposed at intervals. Note that the plurality of second trenches 112 in a certain cross-section, such as those illustrated in FIG. 4, may be connected to one another in the plane layout. It is preferable that the intervals at which the second trenches 112 are disposed be the same as or smaller than the intervals at which the first trenches 12 are disposed.

The second relaxation region 103 is disposed below the second trench 112, and is in contact with the drift layer 10. Typically, the second relaxation region 103 is in contact with the bottom surface of the second trench 112. The second relaxation region 103 has the p type, and preferably has acceptor concentration of $1 \times 10^{14}$ cm$^{-3}$ to $1 \times 10^{18}$ cm$^{-3}$. Note that the acceptor concentration and thickness of the second relaxation region 103 need not be uniform. The second relaxation region 103 may have acceptor concentration the same as the acceptor concentration of the first relaxation region 3. Note that it is preferable that the second relaxation region 103 be electrically connected to the source pad electrode 4 in the present embodiment, but the second relaxation region 103 may be insulated from the source pad electrode 4. Further, it is preferable that the second relaxation region 103 be electrically connected to the first relaxation region 3, but the second relaxation region 103 may be insulated from the first relaxation region 3. Further, the second relaxation region 103 may be directly connected to the first relaxation region 3.

The inner-surface insulation film 102 is provided on the side surface and on the bottom surface of the second trench 112. The thickness (horizontal dimension of FIG. 4) of the inner-surface insulation film 102 on the side surface of the second trench 112 is, for example, 10 nm or more and 300 nm or less. The thickness (vertical dimension of FIG. 4) of the inner-surface insulation film 102 on the bottom surface of the second trench 112 is, for example, 10 nm or more and 300 nm or less. The inner-surface insulation film 102 is mainly made of, for example, silicon dioxide. A material of the inner-surface insulation film 102 may be the same material as the gate insulation film 2 (FIG. 2: first embodiment). Further, the thickness of the inner-surface insulation film 102 provided on the side surface of the second trench 112 may be the same as the thickness of the gate insulation film 2 provided on the side surface of the first trench 12. Further, the thickness of the inner-surface insulation film 102 on the bottom surface of the second trench 112 may be the same as the thickness of the gate insulation film 2 on the bottom surface of the first trench 12.

At least a part of the low-resistance region 101 is provided in the second trench 112 through the inner-surface insulation film 102. The low-resistance region 101 is made of metal or a doped semiconductor. In other words, the low-resistance region 101 is made of a conductor. Accordingly, the low-resistance region 101 can have low resistivity. A material of the low-resistance region 101 may be the same material as the gate electrode 1 (FIG. 2: first embodiment). The low-resistance region 101 is electrically insulated from the gate pad electrode 14 by the inter-layer insulation film 5. Note that it is preferable that the low-resistance region 101 be electrically connected to the source pad electrode 4 in the present embodiment, but the low-resistance region 101 may be insulated from the source pad electrode 4. In the latter case, a floating potential may be employed as a potential of the low-resistance region 101 by arranging the low-resistance region 101 not to be connected to other members.

The drain electrode 104 is provided on a surface (lower surface of FIG. 2 to FIG. 4) of the substrate 11 opposite to a surface on which the drift layer 10 is provided. In this manner, the drain electrode 104 is electrically connected to the drift layer 10 having the n type through the substrate 11 having the n type. Specifically, at least one (two in the present embodiment) interface constituting ohmic junction or interface constituting Schottky junction is provided between the drain electrode 104 and the drift layer 10. Note that the junction part between the drain electrode 104 and the drift layer 10 may include a silicide.

Note that, in the present embodiment, the first conductivity type is an n type and the second conductivity type is a p type. However, as a modification, these conductivity types may be inverted. In such a case, the terms "donor concentration" and "acceptor concentration" used in the above description regarding impurity concentration shall be interchanged. Further, the plane layout illustrated in FIG. 1 is only illustrative, and any disposition may be adopted for the non-element region RN in the plane layout.

(Effects)

According to the present embodiment, capacitance is formed owing to the provision of the low-resistance region 101 in the second trench 112 through the inner-surface insulation film 102. The inner-surface insulation film 102 in the second trench 112 can be formed to have a small thickness, with its insulation reliability being maintained. In this manner, capacitance per unit area can be enhanced. Consequently, at the time of high-speed switching of the MOSFET 701, a displacement current that passes through the second relaxation region 103 below the second trench 112 can be caused to sufficiently branch into the low-resistance region 101 through sufficient capacitive coupling. This reduces effective sheet resistance for the displacement current. Consequently, the magnitude of potential drop due to the displacement current is reduced. Consequently, the magnitude of a voltage between a potential of the second relaxation region 103 and a gate potential due to the potential drop is reduced. Consequently, dielectric breakdown between the second relaxation region 103 and a region including the gate potential, namely the gate pad electrode 14, is reduced.

From the above perspective, it is preferable that capacitance formed by the inner-surface insulation film 102 be high. Accordingly, it is preferable that the thickness of the inner-surface insulation film 102 be as small as possible without losing reliability. If the inner-surface insulation film 102 is formed in the same process as the gate insulation film 2, the inner-surface insulation film 102 having high reliability and a small thickness can be formed. Further, sharing the same process can reduce manufacturing costs. In such a case, the thickness of the inner-surface insulation film 102 is formed into substantially the same thickness as the gate insulation film 2.

Further, to enhance capacitance formed by the inner-surface insulation film 102, it is preferable that permittivity of the inner-surface insulation film 102 be high. To this end, a material having permittivity higher than permittivity of silicon dioxide may be selected as a material of the inner-surface insulation film 102. Further, a material having permittivity higher than permittivity of the material of the gate insulation film 2 may be selected as a material of the inner-surface insulation film 102.

(Modification)

Figure 6:
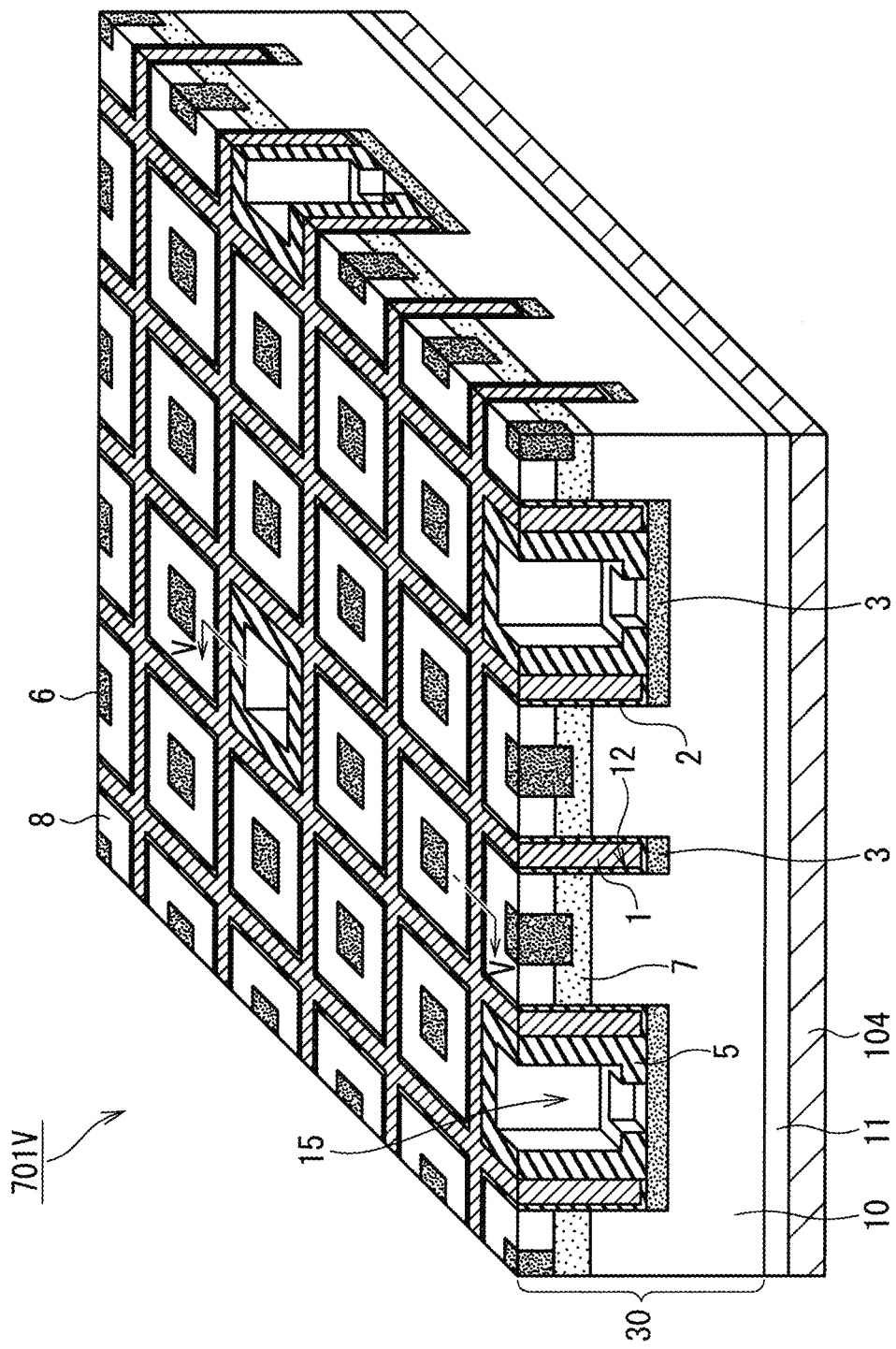
FIG. 6 is a partial cross-sectional perspective view schematically illustrating a configuration of the silicon carbide device according to the modification of the first embodiment of the present invention without a partial configuration on an upper surface side.

FIG. 5 is a partial cross-sectional view schematically illustrating a configuration of a MOSFET 701V (silicon carbide device) according to a modification of the first embodiment, taken along the line V-V of FIG. 6. FIG. 6 is a partial cross-sectional perspective view schematically illustrating a configuration of the MOSFET 701V without a partial configuration on an upper surface side.

In order to achieve electrical connection between the source pad electrode 4 and the first relaxation region 3, a p-type semiconductor region, such as the connection region 9, connects the source pad electrode 4 and the first relaxation region 3 to each other in the MOSFET 701 (FIG. 3). However, in this modification (FIG. 5), the source pad electrode 4 is in contact with the first relaxation region 3. Owing to this contact, ohmic junction or Schottky junction is provided between the source pad electrode 4 and the first relaxation region 3. This contact is achieved by a configuration in which a contact 15 that extends in the inter-layer insulation film 5 is provided in the source pad electrode 4 so as to reach the first relaxation region 3. The contact 15 may be disposed in a trench provided in the epitaxial layer 30. The trench may be disposed in the element region RE, and may be integrated with the first trench 12 as in the figure.

Note that a plurality of first relaxation regions 3 are separated from one another in the cross-section illustrated in FIG. 5, but these are connected to one another in the plane layout.

Second Embodiment

Figure 7:
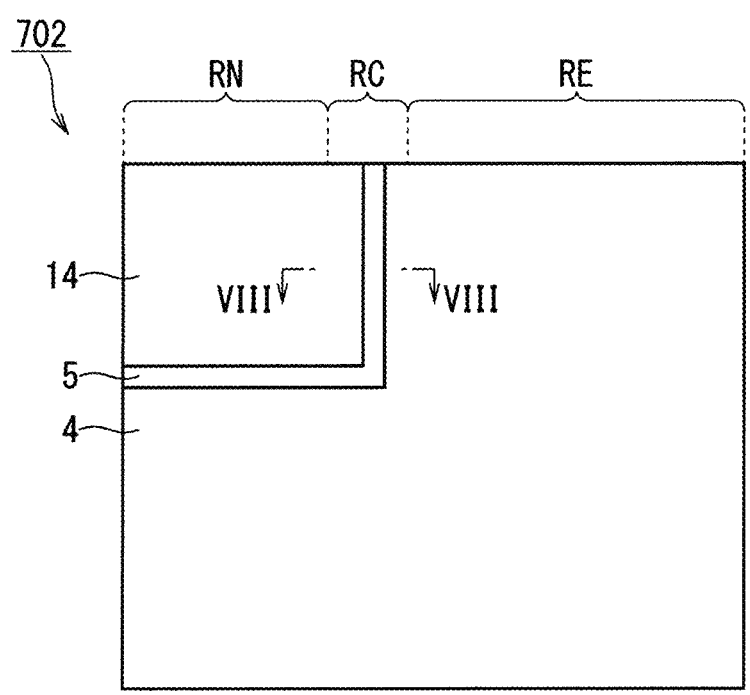
FIG. 7 is a plan view schematically illustrating a configuration of a silicon carbide device according to the second embodiment of the present invention.

FIG. 7 is a plan view schematically illustrating a configuration of a MOSFET 702 (silicon carbide semiconductor device) according to the second embodiment. In plan view, the MOSFET 702 includes a contact region RC between the element region RE and the non-element region RN.

Figure 8:
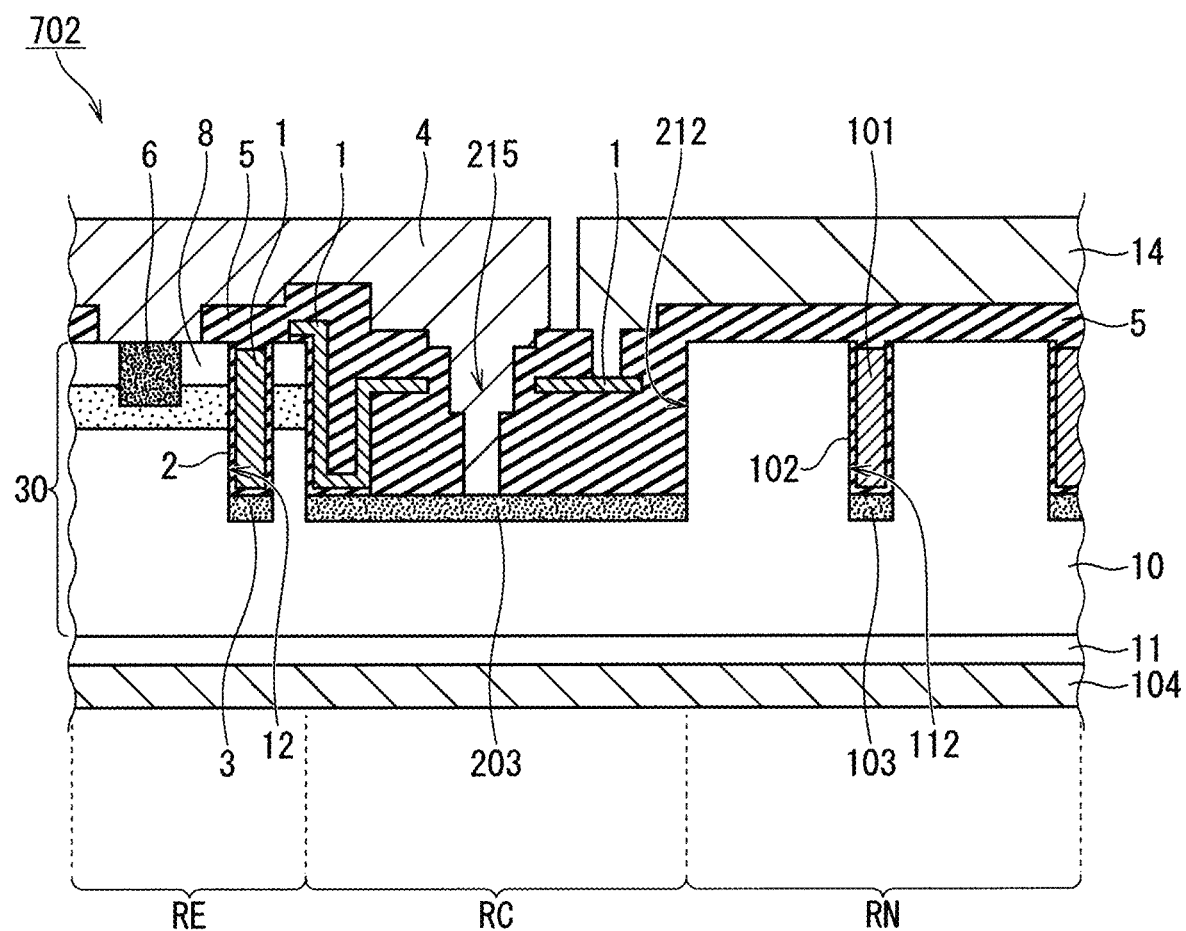
FIG. 8 is a schematic partial cross-sectional view taken along the line VIII-VIII of FIG. 7.

FIG. 8 is a schematic partial cross-sectional view taken along the line VIII-VIII of FIG. 7. In the contact region RC, a drift layer 10 having the n type (first conductivity type) provided on the substrate 11, a third trench 212 whose bottom surface reaches the drift layer 10, and a third relaxation region 203 are provided. In the present embodiment, the third trench 212 is provided in the epitaxial layer 30 in at least a part of the contact region RC. The third trench 212 includes a side surface and a bottom surface. The third trench 212 may have depth the same as the depth of the first trench 12.

The MOSFET 702 includes a third relaxation region 203 disposed in the contact region RC. Specifically, the third relaxation region 203 is disposed below the third trench 212, and is in contact with the drift layer 10. Typically, the third relaxation region 203 is in contact with the bottom surface of the third trench 212. The third relaxation region 203 has the p type. The third relaxation region 203 may have acceptor concentration the same as the acceptor concentration of the first relaxation region 3. The third relaxation region 203 is electrically connected to the second relaxation region 103. Specifically, the third relaxation region 203 is separated from the second relaxation region 103 in the cross-section of FIG. 8, but is connected to the second relaxation region 103 in the plane layout. Note that it is preferable that the third relaxation region 203 be connected to the first relaxation region 3 in the plane layout, but the third relaxation region 203 need not be connected to the first relaxation region 3.

The third relaxation region 203 is electrically connected to the source pad electrode 4. In order to achieve this electrical connection, typically, in the third trench 212, the source pad electrode 4 includes a contact 215 that extends in the inter-layer insulation film 5 to reach the third relaxation region 203. With the contact 215 being in contact with the third relaxation region 203, the source pad electrode 4 and the third relaxation region 203 are joined by means of ohmic junction or Schottky junction. Note that the source pad electrode 4 may include a silicide in the junction part between the source pad electrode 4 and the third relaxation region 203.

The above configuration allows the second relaxation region 103 to be electrically connected to the source pad electrode 4. Specifically, the second relaxation region 103 having the p type is connected to the source pad electrode 4 through only the third relaxation region 203 having the p type.

Note that, in the third trench 212, a part of the gate electrode 1 and a part of the gate pad electrode 14 may be disposed to be in contact with each other. In this manner, electrical connection between the gate electrode 1 and the gate pad electrode 14 is achieved.

Configuration other than that described above is substantially the same as the configuration of the first embodiment described above, and thus the same or corresponding elements will be denoted by the same reference signs, and description thereof will not be repeated.

According to the present embodiment, the second relaxation region 103 is connected to the source pad electrode 4 through the third relaxation region 203. In this manner, a displacement current that flows in the second relaxation region 103 at the time of high-speed switching can be caused to sufficiently flow to the source pad electrode 4 or from the source pad electrode 4. Consequently, the magnitude of potential drop due to the displacement current is further reduced. Consequently, the magnitude of a voltage between a potential of the second relaxation region 103 and a gate potential due to the potential drop is further reduced. Consequently, dielectric breakdown between the second relaxation region 103 and a region including the gate potential, namely the gate pad electrode 14, is more securely reduced.

Note that the plane layout illustrated in FIG. 7 is only illustrative, and any disposition may be adopted for the non-element region RN in the plane layout. Further, the configuration for achieving electrical connection between the source pad electrode 4 and the second relaxation region 103 is not limited to the configuration illustrated in FIG. 8, and for example, these may be in contact with each other.

Third Embodiment

Figure 9:
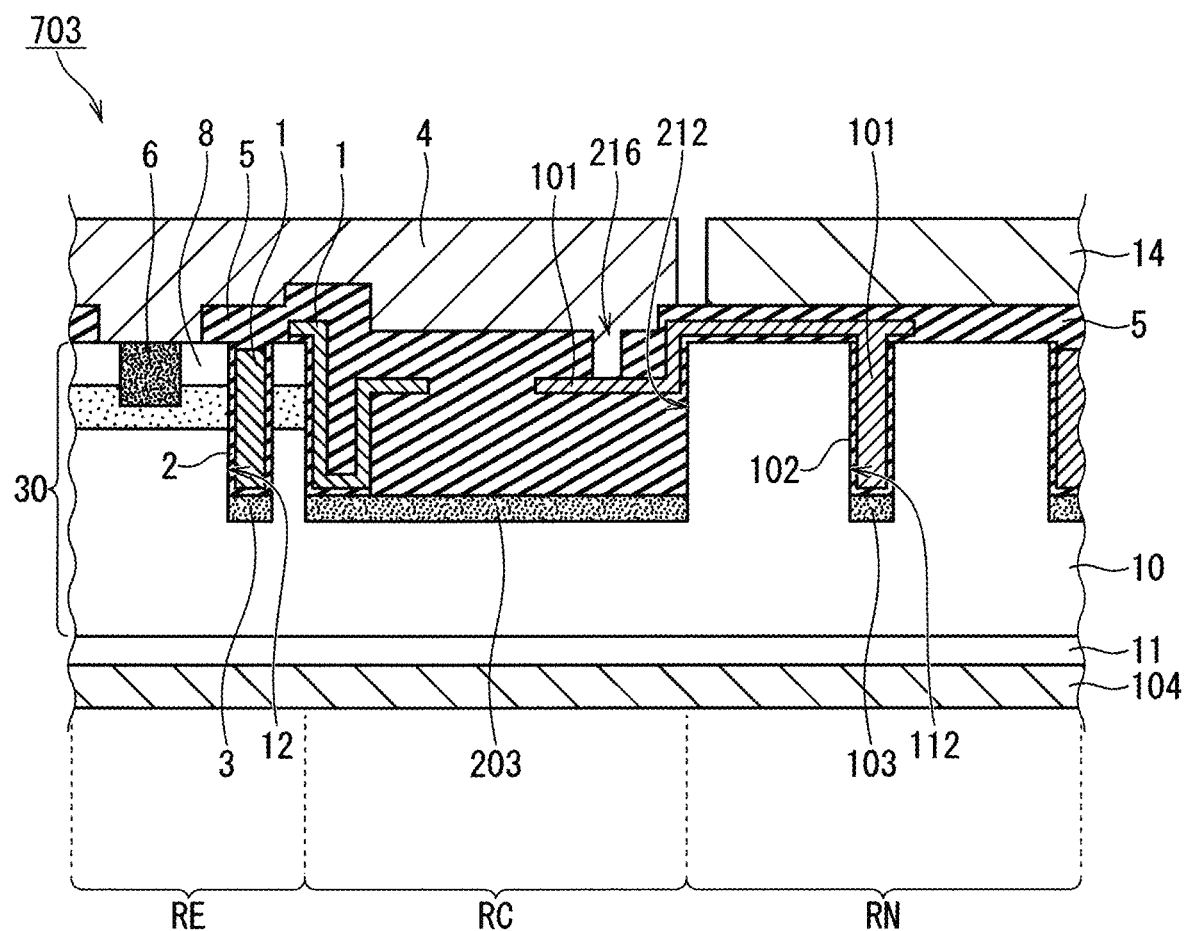
FIG. 9 is a partial cross-sectional view of a configuration of a silicon carbide device according to the third embodiment of the present invention, which is illustrated in a cross-section similar to that taken along the line VIII-VIII of FIG. 7.

FIG. 9 is a partial cross-sectional view of a configuration of a MOSFET 703 (silicon carbide semiconductor device)

according to the third embodiment, which is illustrated in a cross-section similar to that taken along the line VIII-VIII of FIG. 7. In plan view (see FIG. 7), between the element region RE and the non-element region RN, the MOSFET 703 includes a contact region RC in which a part of the low-resistance region 101 (FIG. 9) is disposed. In the configuration of FIG. 9, the low-resistance region 101 has a part disposed in the third trench 212 that is provided in the contact region RC, and this part is connected to a part of the low-resistance region 101 disposed in the second trench 112. In the contact region RC, the low-resistance region 101 and the source pad electrode 4 are electrically connected. In order to achieve this electrical connection, typically, in the contact region RC, the source pad electrode 4 includes a contact 216 that extends in the inter-layer insulation film 5 to reach the low-resistance region 101. With the contact 216 being in contact with the low-resistance region 101, ohmic junction or Schottky junction is provided between the source pad electrode 4 and the low-resistance region 101. In this manner, in the contact region RC, the low-resistance region 101 and the source pad electrode 4 are electrically connected. Note that, in the present embodiment, the contact 215 (FIG. 8: second embodiment) is not provided. Note that, similarly to the second embodiment, the third relaxation region 203 is electrically connected to the second relaxation region 103. Specifically, the third relaxation region 203 is separated from the second relaxation region 103 in the cross-section of FIG. 9, but is connected to the second relaxation region 103 in the plane layout. Note that it is preferable that the third relaxation region 203 be connected to the first relaxation region 3 in the plane layout, but the third relaxation region 203 need not be connected to the first relaxation region 3.

Configuration other than that described above is substantially the same as the configuration of the first or second embodiment described above, and thus the same or corresponding elements will be denoted by the same reference signs, and description thereof will not be repeated.

According to the present embodiment, the low-resistance region 101 is electrically connected to the source pad electrode 4. In this manner, when a displacement current that flows in the second relaxation region 103 at the time of high-speed switching flows in the low-resistance region 101 through capacitive coupling of the inner-surface insulation film 102, the current can be caused to sufficiently flow to the source pad electrode 4 or from the source pad electrode 4. Consequently, the magnitude of potential drop due to the displacement current is further reduced. Consequently, the magnitude of a voltage between a potential of the second relaxation region 103 and a gate potential due to the potential drop is further reduced. Consequently, dielectric breakdown between the second relaxation region 103 and a region including the gate potential, namely the gate pad electrode 14, is more securely reduced.

Fourth Embodiment

Figure 10:
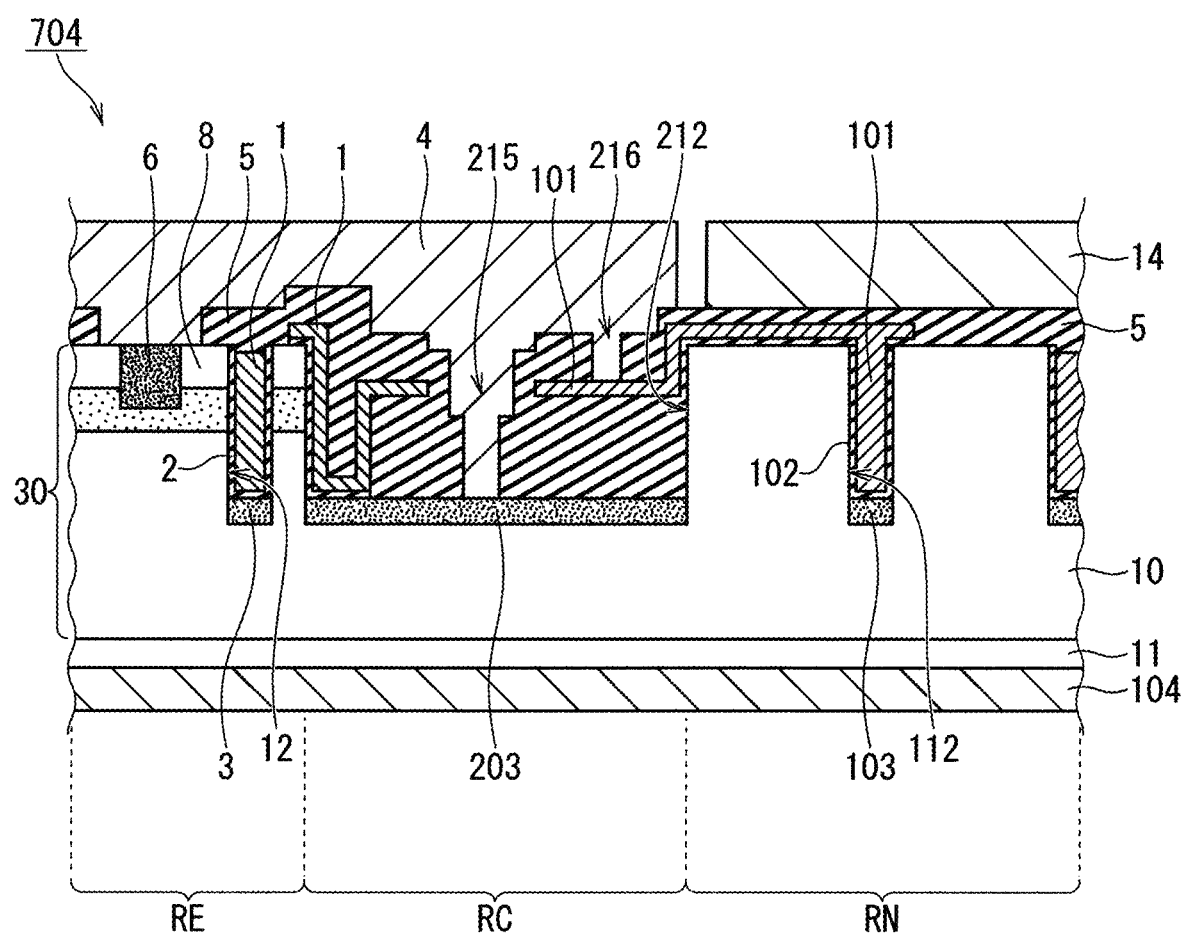
FIG. 10 is a partial cross-sectional view of a configuration of a silicon carbide device according to the fourth embodiment of the present invention, which is illustrated in a cross-section similar to that taken along the line VIII-VIII of FIG. 7.

FIG. 10 is a partial cross-sectional view of a configuration of a MOSFET 704 (silicon carbide semiconductor device) according to the fourth embodiment, which is illustrated in a cross-section similar to that taken along the line VIII-VIII of FIG. 7. Similarly to the MOSFET 703 (FIG. 8: third embodiment), in the MOSFET 704, a part of the low-resistance region 101 is disposed in the contact region RC. With the contact 216 being in contact with the low-resistance region 101 in the contact region RC, ohmic junction or Schottky junction is provided between the source pad electrode 4 and the low-resistance region 101. Further, in the MOSFET 704 (FIG. 10), the low-resistance region 101 and the source pad electrode 4 are electrically connected by the contact 215 in the contact region RC. As described above, in the MOSFET 704, both of the contact 215 described in the second embodiment and the contact 216 described in the third embodiment are provided. This configuration produces effects of both of the second and third embodiments. Note that configuration other than that described above is substantially the same as the configuration of the second or third embodiment described above, and thus the same or corresponding elements will be denoted by the same reference signs, and description thereof will not be repeated.

Fifth Embodiment

Figure 11:
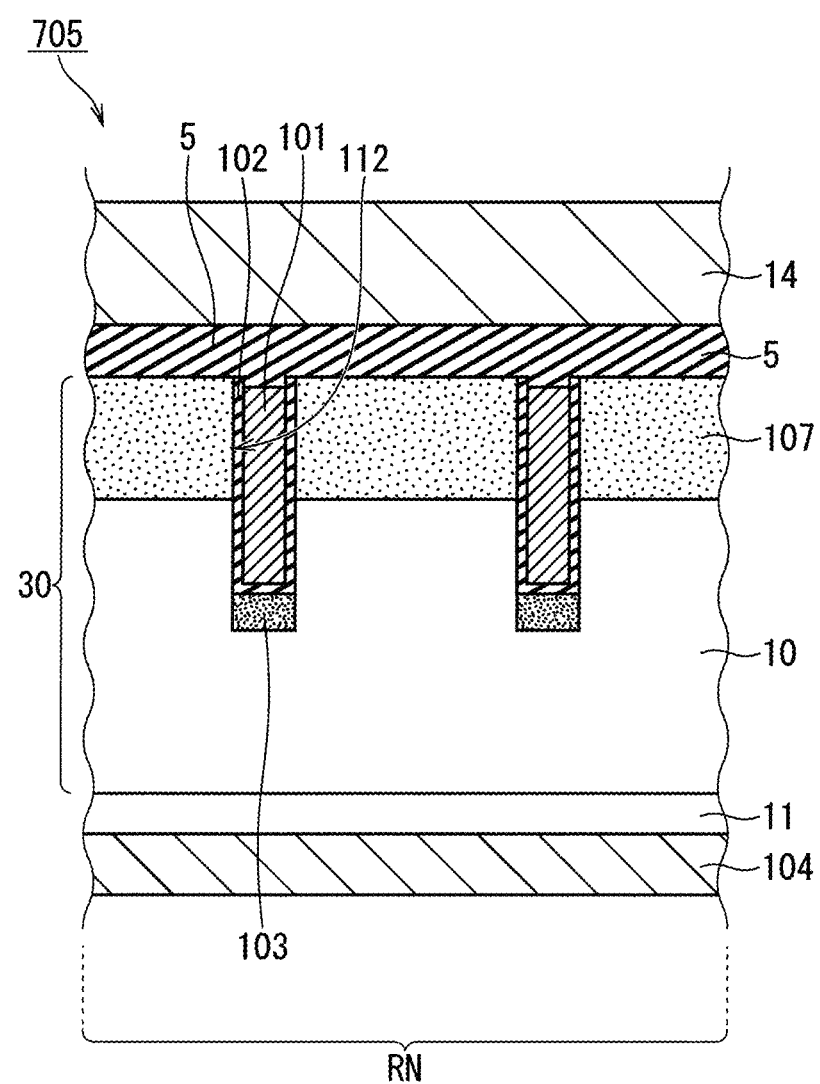
FIG. 11 is a partial cross-sectional view illustrating a configuration of a silicon carbide device according to the fifth embodiment of the present invention in a non-element region.

FIG. 11 is a partial cross-sectional view illustrating a configuration of a MOSFET 705 (silicon carbide device) according to the fifth embodiment in the non-element region RN. The MOSFET 705 includes a configuration in which a first impurity region 107 having the p type is added to the configuration of the first embodiment (FIG. 4). The first impurity region 107 is disposed on the drift layer 10 in the non-element region RN. In the present embodiment, the first impurity region 107 is disposed on a surface of the epitaxial layer 30, and is covered by the inter-layer insulation film 5. It is preferable that the first impurity region 107 be connected to the source pad electrode 4, but the first impurity region 107 need not be connected to the source pad electrode 4. Further, it is preferable that the first impurity region 107 be connected to the base region 7, but the first impurity region 107 need not be connected to the base region 7. It is preferable that the first impurity region 107 have acceptor concentration of $1\times10^{14}$ cm$^{-3}$ to $1\times10^{18}$ cm$^{-3}$. Note that the acceptor concentration and thickness of the first impurity region 107 need not be uniform. Configuration other than that described above is substantially the same as the configuration of the first to fourth embodiments described above, and thus the same or corresponding elements will be denoted by the same reference signs, and description thereof will not be repeated.

According to the present embodiment, owing to the provision of the first impurity region 107, an electric field applied to the inter-layer insulation film 5 and the inner-surface insulation film 102 can be reduced at the time of turning off the MOSFET 705. Consequently, dielectric breakdown of these can be reduced.

Further, at the time of high-speed switching of the MOSFET 705, a displacement current that flows in the low-resistance region 101 and the second relaxation region 103 also flows in the first impurity region 107 through capacitive coupling of the inner-surface insulation film 102. Consequently, the magnitude of potential drop along the second relaxation region 103 is reduced. Consequently, the magnitude of a voltage between a potential of the second relaxation region 103 and a gate potential due to the potential drop is reduced. Consequently, dielectric breakdown between the second relaxation region 103 and a region including the gate potential, namely the gate pad electrode 14, is reduced.

Sixth Embodiment

Figure 12:
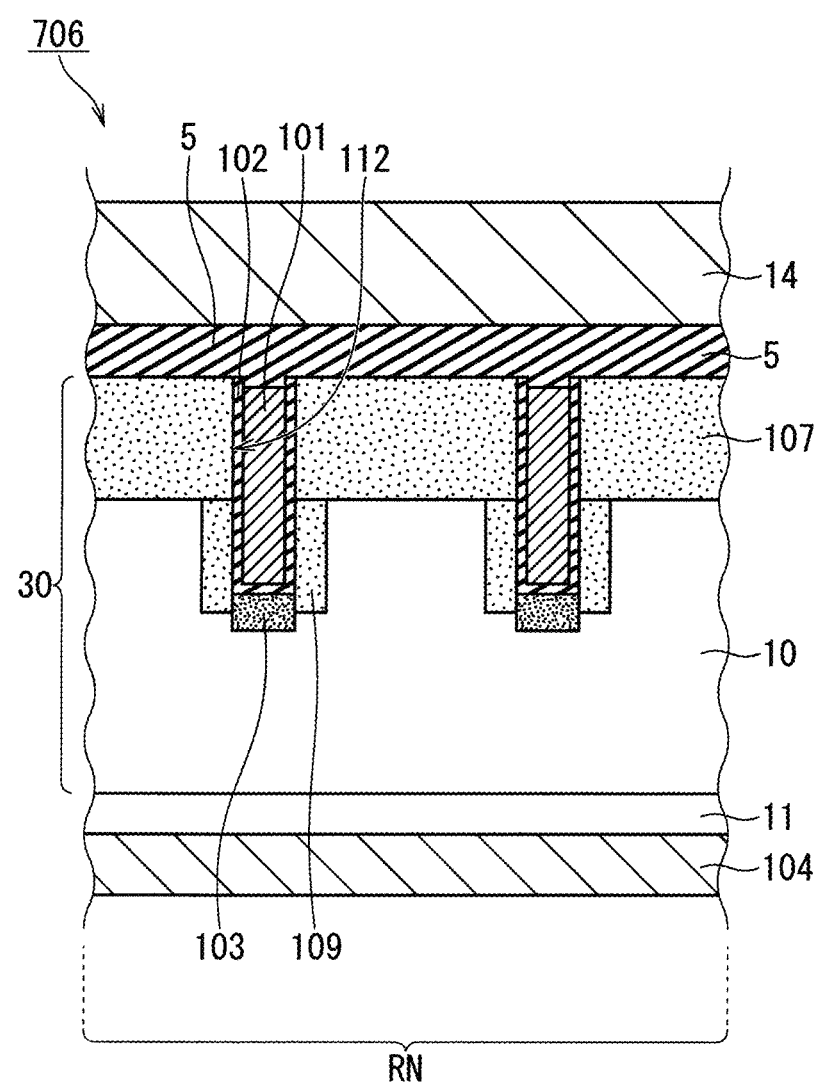
FIG. 12 is a partial cross-sectional view illustrating a configuration of a silicon carbide device according to the sixth embodiment of the present invention in a non-element region.

FIG. 12 is a partial cross-sectional view illustrating a configuration of a MOSFET 706 (silicon carbide semiconductor device) according to the sixth embodiment in the non-element region RN. The MOSFET 706 includes a connection region 109. The connection region 109 is provided adjacently to the side surface of the second trench 112, and is connected to the second relaxation region 103 and the first impurity region 107. The connection region 109 has the p type, and preferably has acceptor concentration of $1 \times 10^{14}$ cm-3 to $1 \times 10^{18}$ cm-3. Note that, as illustrated in FIG. 12, the MOSFET 706 may include a cross-section in which the connection region 109 is not provided. Further, although the connection region 109 is provided on both the sides of the second trench 112 in FIG. 12, the connection region 109 may be provided on only either side thereof. Further, disposition of one connection region 109 provided on one side of the second trench 112 and disposition of another connection region 109 provided on the other side of the second trench 112 may be different in the longitudinal direction of the second trench 112. The acceptor concentration and thickness of the connection region 109 need not be uniform. Note that configuration other than that described above is substantially the same as the configuration of the fifth embodiment described above, and thus the same or corresponding elements will be denoted by the same reference signs, and description thereof will not be repeated.

The present embodiment produces effects similar to those of the fifth embodiment. Further, at the time of high-speed switching of the MOSFET 706, a displacement current that flows in the low-resistance region 101 and the second relaxation region 103 also flows in the connection region 109. Consequently, the magnitude of potential drop along the second relaxation region 103 is reduced. Consequently, the magnitude of a voltage between a potential of the second relaxation region 103 and a gate potential due to the potential drop is reduced. Consequently, dielectric breakdown between the second relaxation region 103 and a region including the gate potential, namely the gate pad electrode 14, is reduced.

Figure 13:
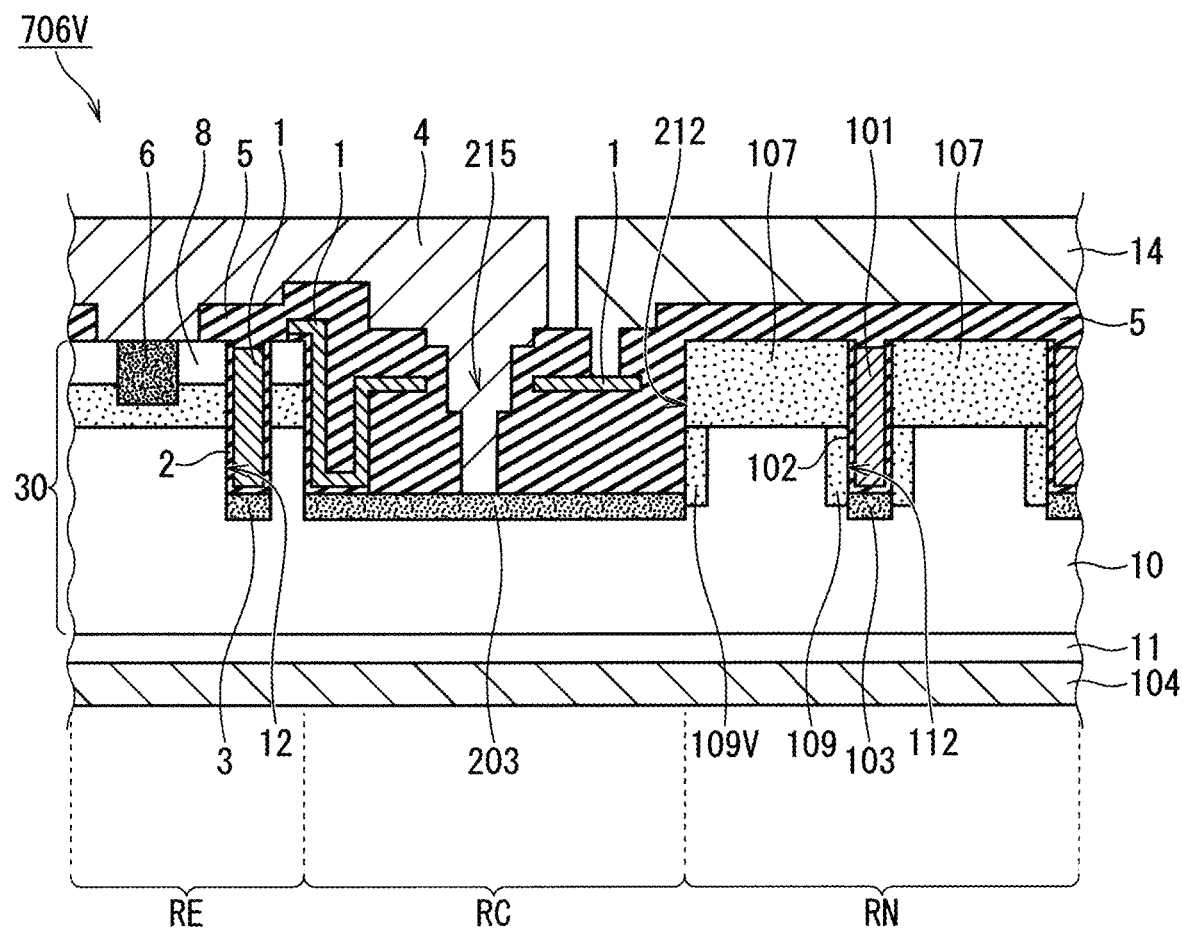
FIG. 13 is a partial cross-sectional view of a configuration of a silicon carbide device according to a modification of the sixth embodiment of the present invention, which is illustrated in a cross-section similar to that taken along the line VIII-VIII of FIG. 7.

FIG. 13 is a partial cross-sectional view of a configuration of a MOSFET 706V (silicon carbide device) according to a modification of the sixth embodiment, which is illustrated in a cross-section similar to that taken along the line VIII-VIII of FIG. 7. In this modification, the above-described configuration of FIG. 12 is applied to the second embodiment (FIG. 8), and a connection region 109V is provided. The connection region 109V is provided on a side surface of the third trench 212 facing the non-element region RN. The connection region 109V connects the third relaxation region 203 and the first impurity region 107 to each other. The connection region 109V has the p type. It is preferable that acceptor concentration of the connection region 109V fall within a range of $1 \times 10^{14}$ cm$^{-3}$ to $1 \times 10^{18}$ cm$^{-3}$, and the acceptor concentration may be the same as that of the connection region 109. Note that the acceptor concentration and thickness of the connection region 109V need not be uniform.

According to this modification, a displacement current that flows in the second relaxation region 103 can flow into the third relaxation region 203 through the connection region 109, the first impurity region 107, and the connection region 109V. Consequently, the current can flow into the source pad electrode 4 in the contact 215 in contact with the third relaxation region 203. Consequently, the magnitude of potential drop along the second relaxation region 103 can be further reduced.

Seventh Embodiment

Figure 14:
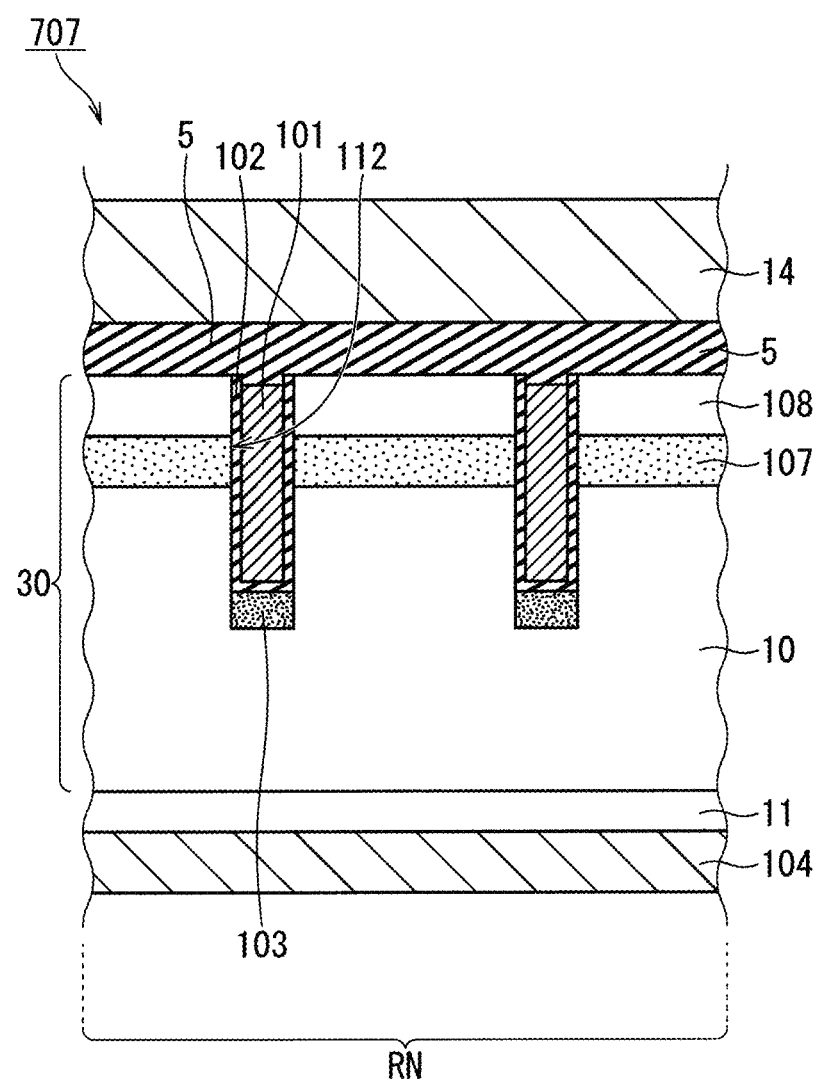
FIG. 14 is a partial cross-sectional view illustrating a configuration of a silicon carbide device according to the seventh embodiment of the present invention in a non-element region.

FIG. 14 is a partial cross-sectional view illustrating a configuration of a MOSFET 707 (silicon carbide device) according to the seventh embodiment in the non-element region RN. The MOSFET 707 includes a configuration in which a second impurity region 108 having the n type is added to the configuration of the fifth embodiment (FIG. 11). The second impurity region 108 is provided on the first impurity region 107. In other words, the first impurity region 107 is disposed on the drift layer 10, at a position immediately below the second impurity region 108. It is preferable that the second impurity region 108 have donor concentration of $1 \times 10^{18}$ cm$^{-3}$ to $1 \times 10^{20}$ cm$^{-3}$. Note that the donor concentration and thickness of the second impurity region 108 need not be uniform. Further, it is preferable that the second impurity region 108 be connected to the source pad electrode 4, but the second impurity region 108 need not be connected to the source pad electrode 4. Configuration other than that described above is substantially the same as the configuration of the fifth or sixth embodiment described above, and thus the same or corresponding elements will be denoted by the same reference signs, and description thereof will not be repeated.

According to the present embodiment, a displacement current that flows in the low-resistance region 101 and the second relaxation region 103 at the time of high-speed switching of the MOSFET 707 can flow into the first impurity region 107 and the second impurity region 108 through capacitive coupling of the inner-surface insulation film 102. Specifically, when the second impurity region 108 is connected to the source pad electrode 4, electrons can flow from the second impurity region 108 into the source pad electrode 4. Further, even when the second impurity region 108 is not connected to the source pad electrode 4, electrons can pass through the second impurity region 108 and the first impurity region 107 in this order to flow into the source pad electrode 4. Consequently, the magnitude of potential drop along the second relaxation region 103 can be further reduced. Consequently, the magnitude of a voltage between a potential of the second relaxation region 103 and a gate potential due to the potential drop is further reduced. Consequently, dielectric breakdown between the second relaxation region 103 and a region including the gate potential, namely the gate pad electrode 14, is more securely reduced.

Eighth Embodiment

Figure 15:
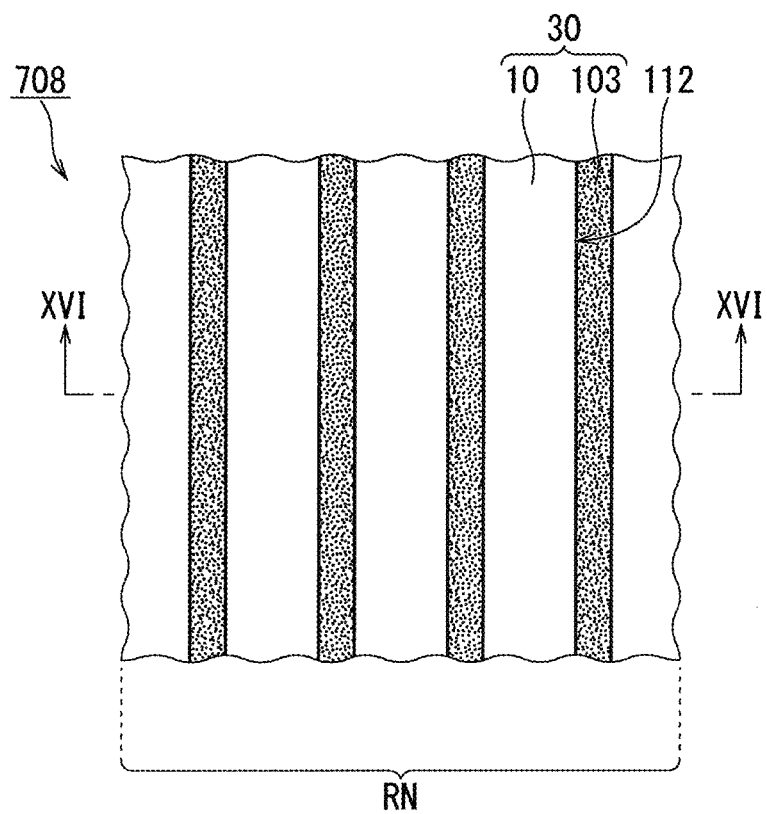
FIG. 15 is a partial plan view illustrating a configuration of a silicon carbide semiconductor layer of a silicon carbide device according to the eighth embodiment of the present invention in a non-element region.

FIG. 15 is a partial plan view illustrating a configuration of the epitaxial layer 30 of a MOSFET 708 (silicon carbide device) according to the eighth embodiment in the non-element region RN. FIG. 16 is a partial cross-sectional view taken along the line XVI-XVI of FIG. 15.

In the present embodiment, a plurality of second trenches 112 are disposed at intervals. Specifically, in FIG. 15, each of these extends in the vertical direction, and these are separated from one another at intervals in the horizontal direction. The second relaxation region 103 is disposed below the second trench 112, specifically, disposed on the bottom surface thereof. In this manner, the plurality of second relaxation regions 103 are disposed to be separated from one another. In FIG. 15, each of these extends in the vertical direction, and these are separated from one another in the horizontal direction by the drift layer 10. Note that configuration other than that described above is substantially the same as the configuration of the first to seventh embodiments described above, and thus the same or corresponding elements will be denoted by the same reference signs, and description thereof will not be repeated.

According to the present embodiment, as illustrated in FIG. 15, a simple plane layout can be used as the plane layout of the non-element region RN. Specifically, line and space plane layout including an array in one direction (horizontal direction in FIG. 15) can be used. This allows for enhancement of reliability of the MOSFET.

Ninth Embodiment

Figure 17:
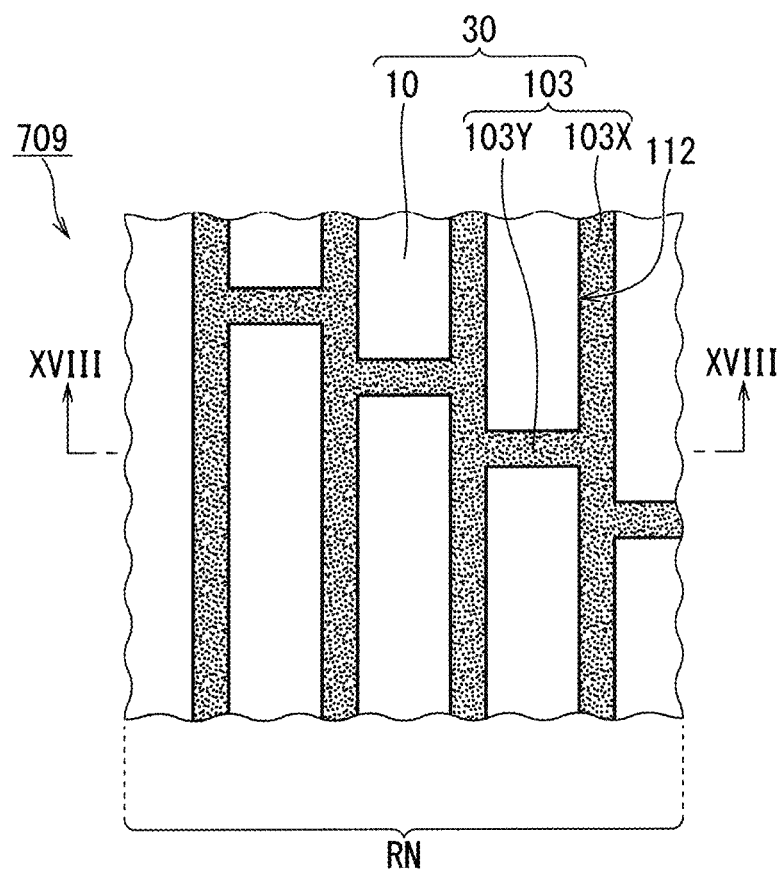
FIG. 17 is a partial plan view illustrating a configuration of a silicon carbide semiconductor layer of a silicon carbide device according to the ninth embodiment of the present invention in a non-element region.
Figure 18:
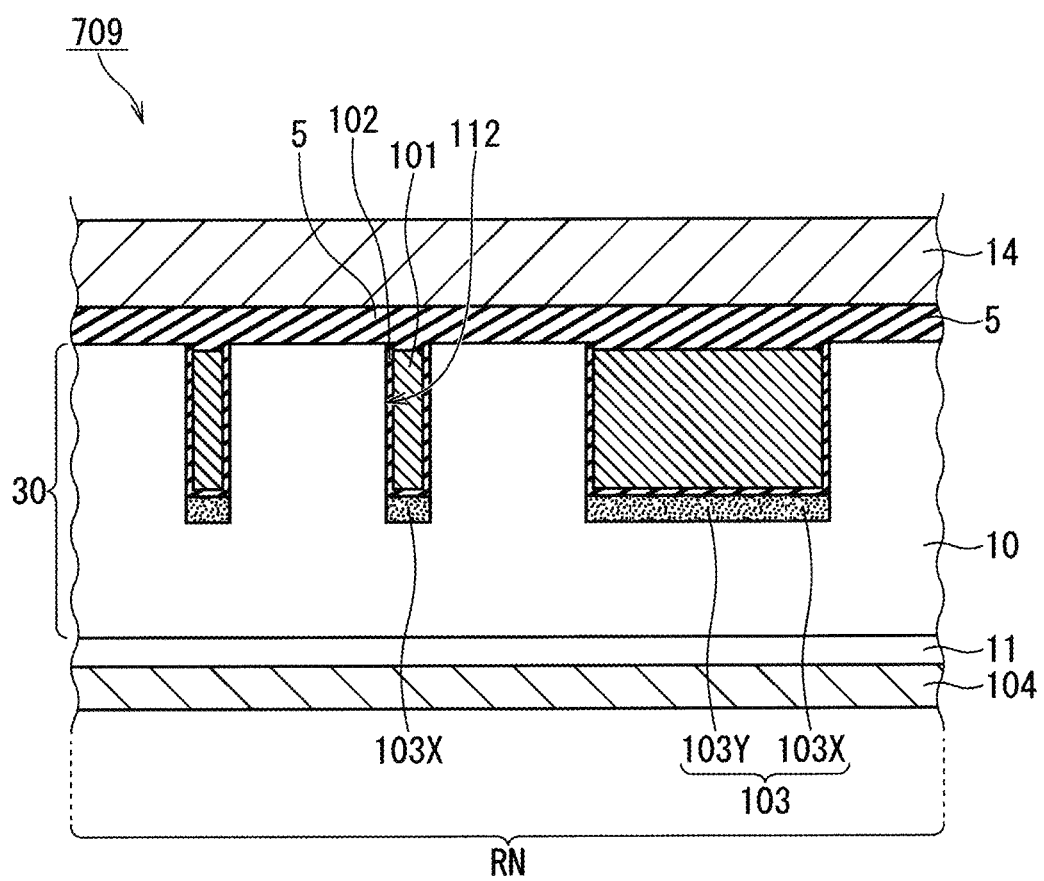
FIG. 18 is a partial cross-sectional view taken along the line XVIII-XVIII of FIG. 17.

FIG. 17 is a partial plan view illustrating a configuration of the epitaxial layer 30 of a MOSFET 709 (silicon carbide device) according to the ninth embodiment in the non-element region RN. FIG. 18 is a partial cross-sectional view taken along the line XVIII-XVIII of FIG. 17.

In the MOSFET 709, the second relaxation region 103 includes a plurality of extending relaxation regions 103X and at least one connection relaxation region 103Y. The plurality of extending relaxation regions 103X are separated from one another, and each of them extends in one direction (vertical direction in the figure). The connection relaxation region 103Y connects adjacent ones of the plurality of extending relaxation regions 103X to each other. In the MOSFET 709, the connection relaxation region 103Y is provided in all of adjacent pairs among the extending relaxation regions 103X.

Figure 19:
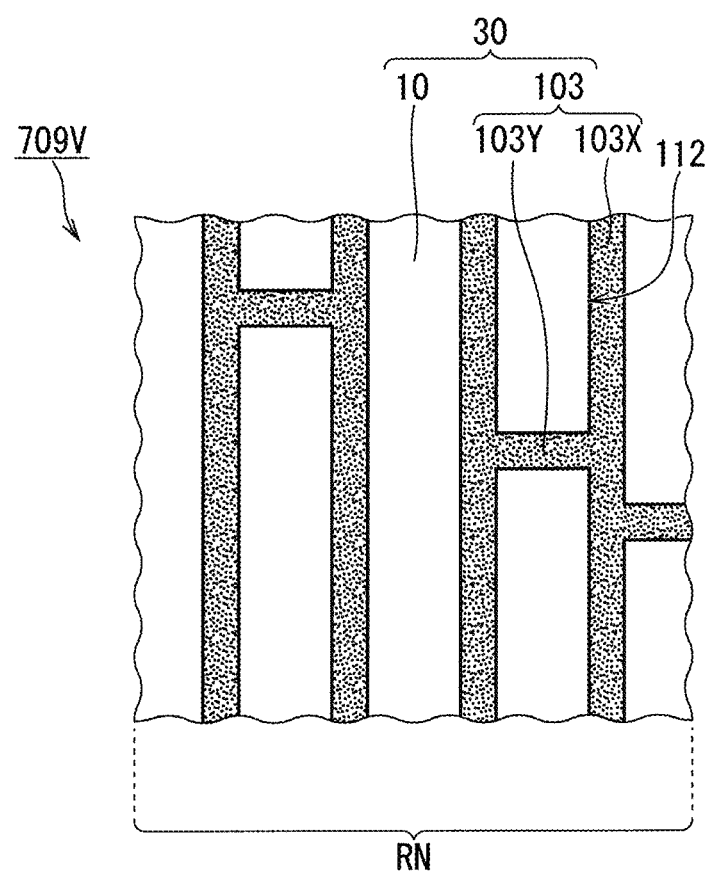
FIG. 19 is a partial plan view illustrating a configuration of a silicon carbide semiconductor layer of a silicon carbide device according to a modification of the ninth embodiment of the present invention in a non-element region.

FIG. 19 is a partial plan view of a configuration of the epitaxial layer 30 of a MOSFET 709V (silicon carbide device) according to a modification of the ninth embodiment in the non-element region RN, which is seen from a viewpoint similar to that of FIG. 17. In the MOSFET 709V, the connection relaxation region 103Y is provided in only at least a part of adjacent pairs among the extending relaxation regions 103X.

Configuration other than that described above is substantially the same as the configuration of the eighth embodiment described above, and thus the same or corresponding elements will be denoted by the same reference signs, and description thereof will not be repeated.

According to the present embodiment, the connection relaxation region 103Y is provided in the second relaxation region 103. This reduces non-uniformity of distribution of a displacement current that flows in the low-resistance region 101 and the second relaxation region 103 at the time of high-speed switching in the non-element region RN. Consequently, non-uniformity of distribution of the magnitude of potential drop along the second relaxation region 103 is reduced. Consequently, local increase of a voltage between the second relaxation region 103 and the gate pad electrode 14 due to the potential drop is reduced. Consequently, dielectric breakdown between the second relaxation region 103 and the gate pad electrode 14 is more securely reduced.

Tenth Embodiment

Figure 20:
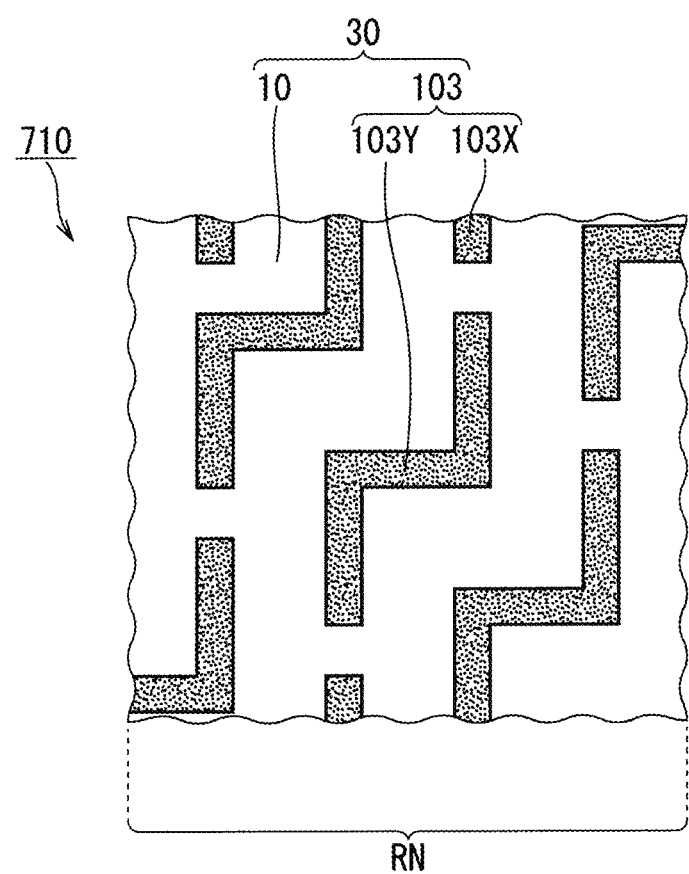
FIG. 20 is a partial plan view illustrating a configuration of a silicon carbide semiconductor layer of a silicon carbide device according to the tenth embodiment of the present invention in a non-element region.

FIG. 20 is a partial plan view illustrating a configuration of the epitaxial layer 30 of a MOSFET 710 (silicon carbide device) according to the tenth embodiment in the non-element region RN. In the present embodiment, each of the extending relaxation regions 103X has a plurality of parts that are separated from one another in its extending direction (vertical direction in the figure). In other words, each of the extending relaxation regions 103X does not extend continuously but extends discretely. Configuration other than that described above is substantially the same as the configuration of the ninth embodiment (FIG. 19) described above, and thus the same or corresponding elements will be denoted by the same reference signs, and description thereof will not be repeated. The present embodiment also produces effects similar to those of the ninth embodiment, owing to the provision of the connection relaxation region 103Y.

Note that, in the present invention, each of the embodiments can be freely combined, and each of the embodiments can be modified or omitted as appropriate within the scope of the invention. While the invention has been shown and described in detail, the foregoing description is in all aspects illustrative and not restrictive. It is therefore understood that numerous unillustrated modifications can be devised without departing from the scope of the invention.

EXPLANATION OF REFERENCE SIGNS

RC contact region, RE element region, RN non-element region, 1 gate electrode, 2 gate insulation film, 3 first relaxation region, 4 source pad electrode, 5 inter-layer insulation film, 6 high-concentration region, 7 base region, 8 source region, 109 connection region, 10 drift layer, 11 substrate (silicon carbide semiconductor substrate), 12 first trench, 14 gate pad electrode, 30 epitaxial layer, 101 low-resistance region, 102 inner-surface insulation film, 103 second relaxation region, 104 drain electrode, 107 first impurity region, 108 second impurity region, 112 second trench, 203 third relaxation region, 212 third trench, 701-710, 701V, 706V, 709V MOSFET (silicon carbide semiconductor device).

The invention claimed is:

1. A silicon carbide semiconductor device including an element region being provided on a silicon carbide semiconductor substrate and a non-element region being provided outside the element region, in which a gate pad electrode being connected to outside and being supplied with a gate voltage from the outside is disposed in the non-element region, the silicon carbide semiconductor device comprising, in the element region and the non-element region, a drift layer having a first conductivity type being provided on the silicon carbide semiconductor substrate, further comprising, in the element region:
  a first trench whose bottom surface reaches the drift layer; and
  a gate electrode being provided in the first trench through a gate insulation film and being electrically connected to the gate pad electrode, and further comprising, in the non-element region:
  at least one second trench whose bottom surface reaches the drift layer;
  at least one second relaxation region having a second conductivity type being disposed below the at least one second trench;
  an inner-surface insulation film being provided on a side surface and on the bottom surface of the at least one second trench; and
  a low-resistance region being provided in the at least one second trench through the inner-surface insulation film and being electrically insulated from the gate pad electrode.

2. The silicon carbide semiconductor device according to claim 1, further comprising, in the element region:
  a base region having the second conductivity type being provided on the drift layer;
  a source region having the first conductivity type being provided on the base region;
  a first relaxation region having the second conductivity type being disposed below the first trench; and
  a source pad electrode being electrically connected to the source region and the first relaxation region, wherein the first trench penetrates the source region and the base region.

3. The silicon carbide semiconductor device according to claim 1, further including a contact region between the element region and the non-element region,
further comprising, in the contact region:
the drift layer having the first conductivity type being provide on the silicon carbide semiconductor substrate;
a third trench whose bottom surface reaches the drift layer; and
a third relaxation region having the second conductivity type being disposed below the third trench, and being electrically connected to each of the source pad electrode and the at least one second relaxation region.

4. The silicon carbide semiconductor device according to claim 3, wherein
a part of the low-resistance region is disposed in the contact region, and the low-resistance region and the source pad electrode are electrically connected in the contact region.

5. The silicon carbide semiconductor device according to claim 1, further including a contact region between the element region and the non-element region, wherein
a part of the low-resistance region is disposed in the contact region, and the low-resistance region and the source pad electrode are electrically connected in the contact region.

6. The silicon carbide semiconductor device according to claim 1, wherein
thickness of the gate insulation film being provided on a side surface of the first trench and thickness of the inner-surface insulation film being provided on the side surface of the at least one second trench are same.

7. The silicon carbide semiconductor device according to claim 1, further comprising, in the non-element region, a first impurity region having the second conductivity type being provided on the drift layer.

8. The silicon carbide semiconductor device according to claim 7, further comprising a connection region having the second conductivity type being provided adjacently to the side surface of the at least one second trench and being connected to the at least one second relaxation region and the first impurity region.

9. The silicon carbide semiconductor device according to claim 7, further comprising a second impurity region having the first conductivity type being provided on the first impurity region.

10. The silicon carbide semiconductor device according to claim 1, wherein
the at least one second relaxation region includes a plurality of second relaxation regions, and the plurality of second relaxation regions are provided to be separated from one another.

11. The silicon carbide semiconductor device according to claim 1, wherein
the at least one second relaxation region includes a plurality of extending relaxation regions being separated from one another, and a connection relaxation region connecting adjacent ones of the plurality of extending relaxation regions to each other.

12. The silicon carbide semiconductor device according to claim 1, wherein
the first trench and the at least one second trench have same depth.

13. The silicon carbide semiconductor device according to claim 1, wherein
the at least one second trench includes a plurality of second trenches, and the plurality of second trenches are provided in the non-element region.

* * * * *